United States Patent
Shimizu et al.

(10) Patent No.: US 6,720,636 B2
(45) Date of Patent: Apr. 13, 2004

(54) SEMICONDUCTOR DEVICE WITH A STAGGERED PAD ARRANGEMENT

(75) Inventors: Kazuyoshi Shimizu, Tokyo (JP); Akira Oizumi, Tokyo (JP); Yasufumi Mori, Tokyo (JP); Akira Mukai, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/291,649

(22) Filed: Nov. 12, 2002

(65) Prior Publication Data

US 2003/0215982 A1 Nov. 20, 2003

(30) Foreign Application Priority Data

May 14, 2002 (JP) .......................... 2002-139148

(51) Int. Cl.[7] .............................. H01L 31/00
(52) U.S. Cl. .................. 257/459; 257/673; 257/737
(58) Field of Search ................. 257/459, 673, 257/737

(56) References Cited

FOREIGN PATENT DOCUMENTS

| JP | 6-275794 | 9/1994 |
|---|---|---|
| JP | 7-74456 | 3/1995 |
| JP | 11-145328 | 5/1999 |
| JP | 2000-243878 | 9/2000 |

*Primary Examiner*—Dung Le
(74) *Attorney, Agent, or Firm*—Burns, Doane, Swecker & Mathis, L.L.P.

(57) ABSTRACT

A semiconductor device includes a plurality of internal row pads and external row pads, consisting of a pad and a pad-control portion that controls an input signal from and an output signal to the pad. The pad and the pad-control portion of the internal row pad are disposed in relationship of reversed arrangement with the pad and the pad-control portion of the external row pad. A plurality of the internal row pads in which the pad and the pad-control portion are disposed in the bonding direction and a plurality of the external row pads in which the pad and the pad-control portion are disposed in the bonding direction are each alternately disposed adjacent perpendicularly to the bonding direction.

9 Claims, 5 Drawing Sheets

CHIP INSIDE DIRECTION ← → BONDING DIRECTION

SEMICONDUCTOR DEVICE WITH A STAGGERED PAD ARRANGEMENT

BACKGROUND OF THE INVENTION

1. Field of the Invention

The present invention relates to a semiconductor device having a pad and a pad-control portion that controls the input/output signals of the pad.

2. Description of the Prior Art

FIG. 9 is a layout diagram showing a conventional semiconductor device that operates with two power supplies (internal and external power supplies). Referring to the figure, reference numeral 1a, 1b denote respectively pads including an internal row pad 6 and an external row pad 7; and 2 denotes a pad-control portion which is electrically connected to the pad 1a, 1b and which controls an input signal from the pad 1a, 1b and an output signal to the pad 1a, 1b. In the pad-control portion 2, reference numeral 3 denotes a protection portion that is composed of capacitance, for instance, and electrically protects elements within the semiconductor chip; 4 denotes a level shifter portion that converts the input and output signals between the internal power supply and the external power supply; and 5 denotes a logic portion that is composed of logical circuits or the like, and logically converts the input and output signals.

Reference numeral 6 denotes an internal row pad that has a short length between the pad 1a and the pad-control portion 2, and 7 denotes an external row pad that has a long length between the pad 1b and the pad-control portion 2.

Reference numeral 8 denotes a distance between the pads 1a, 1b of the external row pads 7 which are adjacent to each other.

Reference symbol VDD represents an internal power supply wiring; VSS represents an internal ground wiring; VDDX represents an external power supply wiring; and VSSX represents an external ground wiring. These wirings are used for supplying power to the pad-control portions 2.

The operation will now be described as below.

Referring to FIG. 9, the pads 1a, 1b each are provided with the pad-control portion 2. The pad-control portion 2 level-shifts or controls the input/output signals of the pad 1a, 1b by use of two power supplies from the internal power supply wiring VDD and the internal ground wiring VSS; and the external power supply wiring VDDX and the external ground wiring VSSX.

There is a restraint in minimum size of the pads 1a, 1b because the pads 1a, 1b each are bonded with a wire. Moreover, there is also a restraint in minimum length of the spacing between the adjacent pads 1a, 1b because the deterioration of the electrical properties of the input/output signals must be prevented.

By the way, a smaller area of a semiconductor chip has recently been required, and on the other hand, multiple pins on the chip have been developed with an increase in the functionality of semiconductor devices. For this reason, in FIG. 9, the short and the long distances between the pads 1a, 1b and the pad-control portion 2 are alternately used, and the pads 1a, 1b are disposed in a staggered arrangement. Thereby, the area to be occupied by the pads 1a, 1b and the pad-control portions 2 can be reduced to meet the demand of increasing pins on the chip. The lay-out of such pads 1a, 1b is referred to as a staggered pad herein. The portion consisting of a pad 1a and a pad-control portion 2, having a shorter distance between the pad 1a and the pad-control portion 2 is referred to as an internal row pad 6, and the portion composed of a pad 1b and a pad-control portion 2, having a longer distance between the pad 1b and the pad-control portions 2 is referred to as an external row pad 7.

The conventional semiconductor device is arranged as mentioned above. Thus, the area to be occupied by the pads 1a, 1b and the pad-control portions 2 is reduced to meet the demand of increasing pins by means of disposing the pads in a staggered arrangement. However, in such an arrangement, the distance 8 between the pads 1a, 1b adjacent to each other of the external row pads 7 is longer, as shown in FIG. 9.

As described above, there has been a drawback that a smaller area of the semiconductor chip is avoided since the area not occupied by elements thus remains on the semiconductor chip.

SUMMARY OF THE INVENTION

The present invention has been accomplished to solve the above-mentioned drawback. An object of the present invention is to provide a semiconductor device which reduces the layout area of pads and pad-control portions to thereby perform a smaller area of a semiconductor chip.

According to one aspect of the present invention, there is provided a semiconductor device in which a pad and a pad-control portion within an internal row pad are disposed in a relationship of reversed arrangement with the pad and the pad-control portion within an external row pad; the pads and the pad-control portions of the internal row pad and of the external row pad are disposed in the same direction as the bonding direction; and a plurality of the internal row pads and a plurality of the external row pads each are alternately disposed adjacent perpendicularly to the bonding direction.

According to another aspect of the present invention, there is provided a semiconductor device in which a pad and a pad-control portion within an internal row pad are disposed in a relationship of reversed arrangement with the pad and the pad-control portion within an external row pad; the pads and the pad-control portions of the internal row pad and of the external row pad are disposed perpendicularly to the bonding direction; and a plurality of the internal row pads and the external row pads forming a pair in the bonding direction are disposed perpendicularly to the bonding direction.

According to still another aspect of the present invention, the internal row pads and external row pads are disposed in a staggered arrangement closer to the chip outside than the pad-control portion, and at least one corner of the rectangular pattern is rounded off in the pattern shape of the pad.

As mentioned above, according to the present invention, the area occupied by the pad and the pad-control portion can be reduced in the bonding direction, thereby effecting a smaller area of the semiconductor chip.

DETAILED DESCRIPTION OF THE PREFERRED EMBODIMENTS

An embodiment of the present invention will be described below.

Embodiment 1

Figure 1:
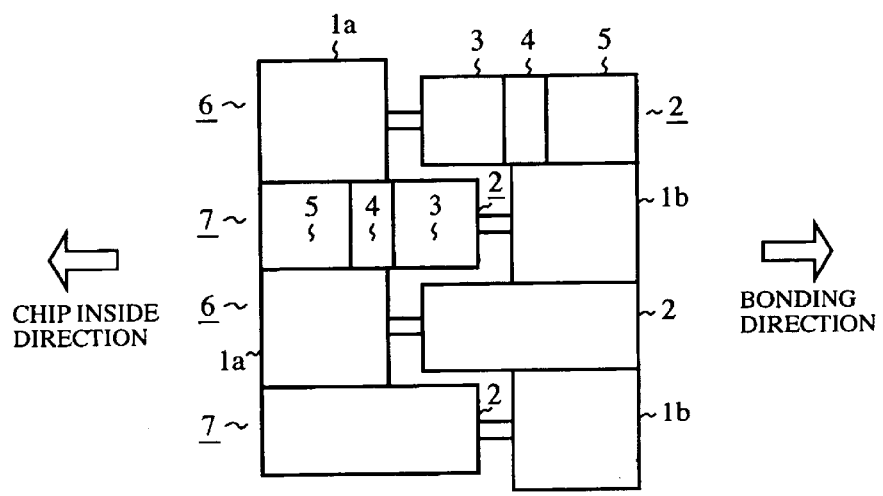
FIG. 1 is a layout diagram showing a semiconductor device in accordance with an embodiment 1 of the present invention.

FIG. 1 is a layout diagram showing a semiconductor device in accordance with an embodiment 1 of the present invention. Referring to the figure, reference numeral 1a, 1b denote respectively pads including an internal row pad 6 and an external row pad 7; and 2 denotes a pad-control portion which is electrically connected to the pad 1a, 1b and which controls an input signal from the pad 1a, 1b and an output signal to the pad 1a, 1b. In the pad-control portion 2, reference numeral 3 denotes a protection portion that is composed of capacitance, for instance, and electrically protects elements within the semiconductor chip; 4 denotes a level shifter portion that converts the input and output signals between the internal power supply and the external power supply; and 5 denotes a logic portion that is composed of logical circuits or the like, and logically converts the input/output signals.

Reference numeral 6 denotes an internal row pad in which the pad 1a is disposed on the side of the chip inside and which consists of the pad 1a and the pad-control portion 2; 7 denotes an external row pad in which the pad 1b is disposed on the side of bonding, and the pad 1b and the pad-control portion 2 thereof are disposed in a relationship of reversed arrangement with the pad 1a and the pad-control portion 2 within the internal row pad 6. In addition, the pads 1a, 1b and the pad-control portions 2 of the internal row pad 6 and of the external row pad 7 are disposed in the same direction as the bonding direction, and a plurality of the internal row pads 6 and a plurality of the external row pads 7 each are alternately disposed adjacent perpendicularly to the bonding direction.

The operation will now be described as below.

Referring to FIG. 1, the pads 1a, 1b each are provided with the pad-control portion 2. Also in the embodiment 1, the input/output signals of the pad 1 are level-shifted or controlled by use of two power supplies similarly to the conventional technology. However, the explanation will be specifically given in an embodiment 3 described below.

There is a restraint in minimum size of the pads 1a, 1b because the pads 1a, 1b each are bonded with a wire. Moreover, there is also a restraint in minimum length of the spacing between the adjacent pads 1a, 1b because the deterioration of the electrical properties of the input/output signals must be prevented.

In FIG. 1, a plurality of the internal row pads 6, and a plurality of the external row pads 7, in which the pad 1b and the pad-control portion 2 thereof are disposed in relationship of a reversed arrangement with the pad 1a and the pad-control portion 2 within the internal row pad 6, are alternately disposed adjacent to each other and perpendicularly to the bonding direction, namely disposed in a staggered pad arrangement. Thereby, the area occupied by the pads 1a, 1b and the pad-control portions 2 is reduced with respect to the bonding direction. Such an arrangement can reduce extremely the area which is not occupied by elements on the semiconductor chip, thereby performing a smaller area of the semiconductor chip.

In addition, the pad-control portion 2 is usually composed of a transistor or the like. Since an element in the internal row pad 6 is disposed in the relationship of a reversed arrangement with one in the external row pad 7, the pad-control portions 2 in the internal and external row pads 6, 7 has areas in which a Pch transistor and a Nch transistor are located in the relationship of a reversed arrangement with the external row pad 7 by reason of wiring.

As described above, according to the embodiment 1, since the pad 1a and pad-control portion 2 in the internal row pad 6 and the pad 1b and pad-control portion 2 in the external row pad 7 are disposed in the same direction as the bonding direction, while the pad 1a and pad-control portion 2 is disposed in a reversed arrangement with the pad 1b and pad-control portion 2, whereby a staggered pad arrangement perpendicular to the bonding direction is performed, rendering an effective use of the lay-out region on the semiconductor chip and thereby performing a small area of the semiconductor chip.

Embodiment 2

Figure 2:
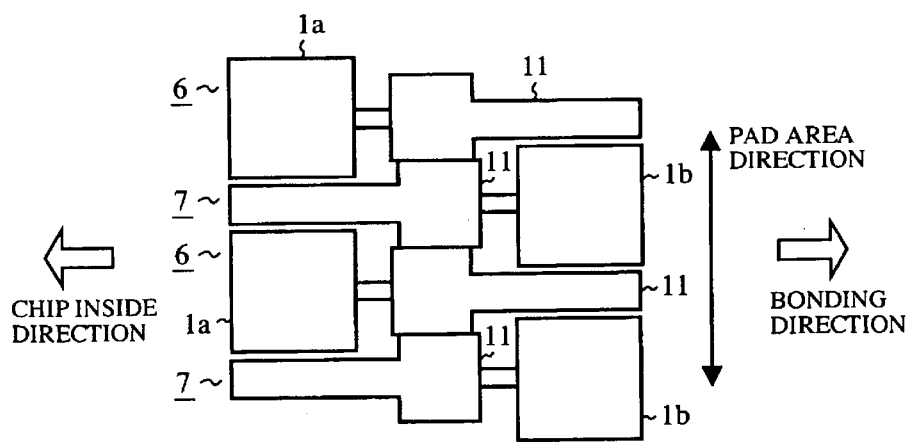
FIG. 2 is a layout diagram showing a semiconductor device in accordance with an embodiment 2 of the present invention.

FIG. 2 is a layout diagram showing a semiconductor device in accordance with an embodiment 2 of the present invention. Referring to the figure, reference numeral 11 denotes a pad-control portion that is narrowed in the vicinity of the pads 1a, 1b adjacent to the pad-control portion perpendicularly to the bonding direction, to thereby have a generally T shape in the outer appearance. The semiconductor device has the same configuration as that shown in FIG. 1 except this feature.

The operation will now be described as below.

In FIG. 2, the pad-control portion 11 is narrowed in the vicinity of the pads 1a, 1b adjacent to the pad-control portion perpendicularly to the bonding direction, to thereby have a generally T-shape in the outer appearance.

Figure 9:
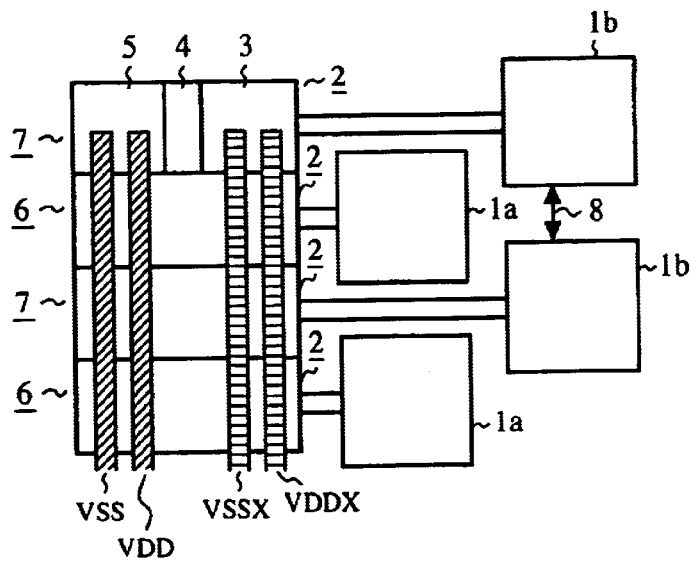
FIG. 9 is a layout diagram showing a conventional semiconductor device.

In such a way, the area arranged or occupied by the pads 1a, 1b and the pad-control portions 11 is reduced perpendicularly to the bonding direction. Such an arrangement can reduce the size of the semiconductor chip and simultaneously maintain the same pattern pitch of the pads (total number of pads) as that in the configuration shown in FIG. 9.

As described above, according to the embodiment 2, the pattern shape of the pad-control portion 11 is formed in a substantially T-shape to be narrowed in the vicinity of the pads 1a, 1b adjacent to each other, and perpendicularly in the bonding direction, whereby the pattern pitch between the pads 1a, 1b can be narrowed, thereby developing a smaller area of the semiconductor chip.

Embodiment 3

Figure 3:
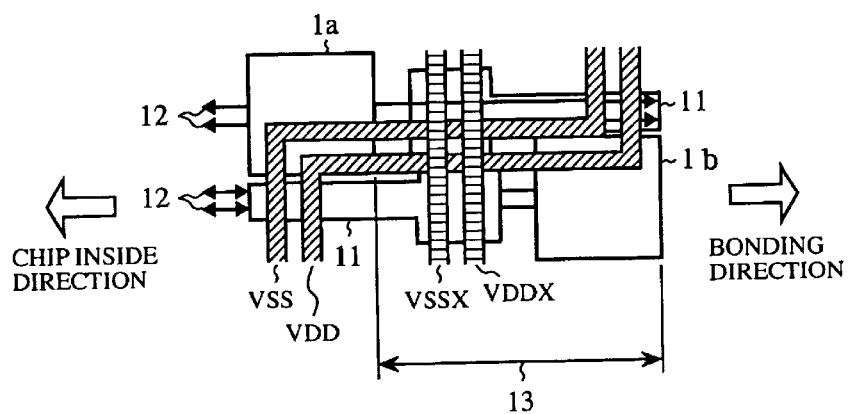
FIG. 3 is a layout diagram showing the semiconductor device in accordance with an embodiment 3 of the present invention.

FIG. 3 is a layout diagram showing the semiconductor device in accordance with an embodiment 3 of the present invention. Referring to the figure, the wiring within a pad-control portion 11 is formed by use of a first layer metal wiring. Reference numeral 12 denotes a connection wiring connecting the pad-control portion 11 and the inside of the semiconductor chip. The connection wiring 12 is formed directly below pads 1a, 1b by use of a second layer metal wiring.

Reference symbol VDD represents an internal power supply wiring, VSS represents an internal ground wiring, and the two wirings are formed by use of a third layer metal wiring. Reference symbol VDDX represents an external power supply wiring, VSSX represents an external ground wiring, and the two wirings and the pads 1a, 1b are formed by use of a fourth layer metal wiring.

Reference numeral 13 represents a distance between the pad 1a of an internal row pad 6 and the pad 1b of an external row pad 7. The semiconductor device has the same configuration as the device shown in FIG. 2 except this feature.

Figure 4:
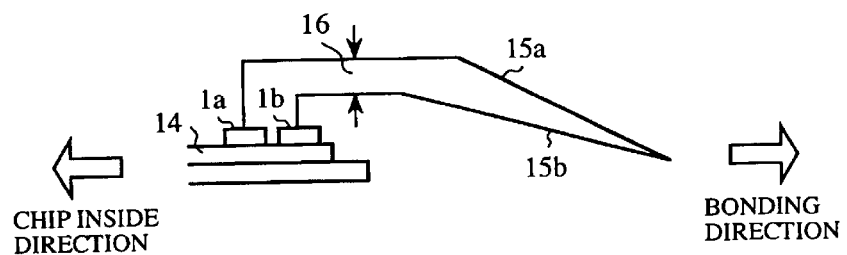
FIG. 4 is a sectional view showing the semiconductor device in accordance with the embodiment 3 of the present invention.

FIG. 4 is a sectional view showing the semiconductor device in accordance with the embodiment 3 of the present invention. Referring to the figure, reference numeral 1a denotes a pad of the internal row pad 6, and 1b denotes a pad of the external row pad 7. Reference numeral 14 denotes a semiconductor chip; 15a denotes a wire bonded to the pad 1a of the internal row pad 6; 15b denotes a wire bonded to the pad 1b of the external row pad 7, and 16 denotes the difference in height between the wire 15a and the wire 15b.

The operation will now be described as below.

Referring to FIG. 3, the pads 1a, 1b are provided with the pad-control portion 2. The pad-control portion 2 level-shifts or controls the input/output signals of the pads 1a, 1b by use of two power supplies from the internal power supply wiring VDD and the internal ground wiring VSS, and the external power supply wiring VDDX and the external ground wiring VSSX.

In the embodiments 1 and 2, differing from the conventional technology, because the internal row pad 6 is disposed in a relationship of reversed arrangement with the external row pad 7, the internal power supply wiring VDD and the internal ground wiring VSS are wired in a zigzag form such that the two wirings located on the pad 1a, 1b of one pad-control portion 2 then pass over the edge of the pad 1a, 1b opposing the above-mentioned pad 1a, 1b. The logic portion 5 is optionally formed within the inside of the semiconductor chip in order to avoid that the internal power supply wiring VDD and the internal ground wiring VSS become too long.

In the embodiment 3, the connection wiring 12 connecting the pad-control portion 2 of the internal row pad 6 and the inside of the semiconductor chip is formed by use of a second layer metal wiring, for instance. That is, the pad 1a, 1b are formed by use of a fourth layer metal wiring, for instance, and thereby the connection wiring 12 can be formed directly below the pads 1a, 1b by use of a lower-layer metal wiring (the second layer metal wiring, for instance) than the pads 1a, 1b. When the connection wiring 12 is formed such that the wiring detours around the pads 1a, 1b, the area occupied by the wiring increases by the detoured part within the connection wiring 12. However, the above-mentioned wiring can maintain the size reduction of the semiconductor chip because the connection wiring 12 is formed directly below the pads 1a, 1b without detouring around the pads 1a, 1b.

Because the distance 13 between the pads 1a, 1b of the internal row pad 6 and the external row pad 7 becomes long when using these arrangements, there is a possibility that the distance between the wires from the pads 1a, 1b of the internal row pad 6 and the external row pad 7 that are adjacent each other becomes short and thereby the two wires intersect each other.

One method of solving the problem of the intersection of the wires 15a and 15b is through the use of a sufficiently large difference in height 16 between the bonded wire 15a with the pad 1a of the internal row pad 6 and the bonded wire 15b with the pad 1b of the internal row pad 7, as shown in FIG. 4.

As described above, according to the embodiment 3, the connection wiring between the pad-control portion 11 of the internal row pad 6 and the inside of the semiconductor chip is constructed so as to be connected directly below the pad 1a, 1b with a metal wiring below the pads 1a, 1b, thereby performing a smaller area of the semiconductor chip without detouring the pads 1a, 1b.

Embodiment 4

Figure 5:
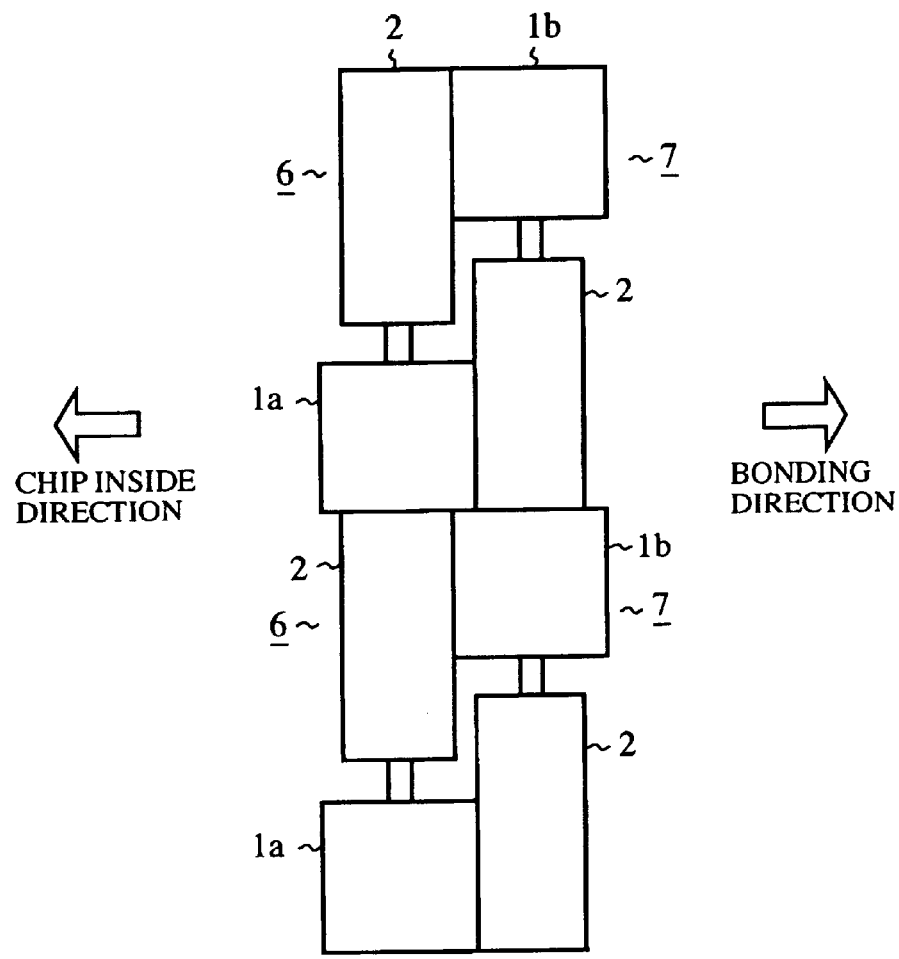
FIG. 5 is a layout diagram showing the semiconductor device in accordance with an embodiment 4 of the present invention.

FIG. 5 is a layout diagram showing the semiconductor device in accordance with an embodiment 4 of the present invention. Referring to the figure, reference numeral 1a, 1b each denote a pad; and 2 denotes a pad-control portion that controls an input signal from and an output signal to the pad 1a, 1b. Reference numeral 6 denotes an internal row pad in which the pad 1a is disposed on the side of the chip inside and composed of the pad 1a and the pad-control portion 2; and 7 denotes an external row pad in which the pad 1b is disposed on the side of bonding, and the pad 1a and the pad-control portion 2 thereof are disposed in a relationship of reversed arrangement with the pad 1a and the pad-control portion 2 of the internal row pad 6.

In addition, the pads 1a, 1b and the pad-control portions 2 of the internal row pad 6 and of the external row pad 7 are disposed perpendicularly to the bonding direction, and a plurality of the internal row pads 6 and the external row pads 7 forming a pair in the bonding direction are disposed perpendicularly to the bonding direction.

The operation will now be described as below.

In FIG. 5, a plurality of the internal row pads 6 and the external row pads 7 in which the pad 1b and the pad-control portion 2 thereof are disposed in a relationship of reversed arrangement with the pad 1a and the pad-control portion 2 of the internal row pad 6, forming a pair in the bonding direction are disposed perpendicularly to the bonding direction.

By disposing the internal row pads and the external row pads in such arrangement, the pads 1a, 1b of the internal row pads 6 and of the external row pads 7 are disposed in a staggered pad arrangement, to thereby reduce the layout area of the pads 1a, 1b and the pad-control portions 2 in the bonding direction. Such an arrangement extremely reduces the area not occupied by elements within the semiconductor chip, and can thereby reduce the size of the semiconductor chip. In addition, in such an arrangement, because the distance between the pads 1a, 1b of the internal row pad 6 and the external row pad 7 is short, the problem of the intersection of the wires from the pads 1a, 1b of the internal row pad 6 and the external row pads 7 adjacent to each other can be solved.

As described above, according to the embodiment 4, since the pad 1a and pad-control portion 2 in the internal row pad 6 and the pad 1b and pad-control portion 2 in the external row pad 7 are disposed perpendicularly to the bonding direction, while the pad 1a and pad-control portion 2 is disposed in a reversed arrangement with the pad 1b and pad-control portion 2, which renders a staggered pad arrangement perpendicular to the bonding direction, thereby using the layout region on the semiconductor chip effectively and performing a small area of the semiconductor chip.

Embodiment 5

Figure 6:
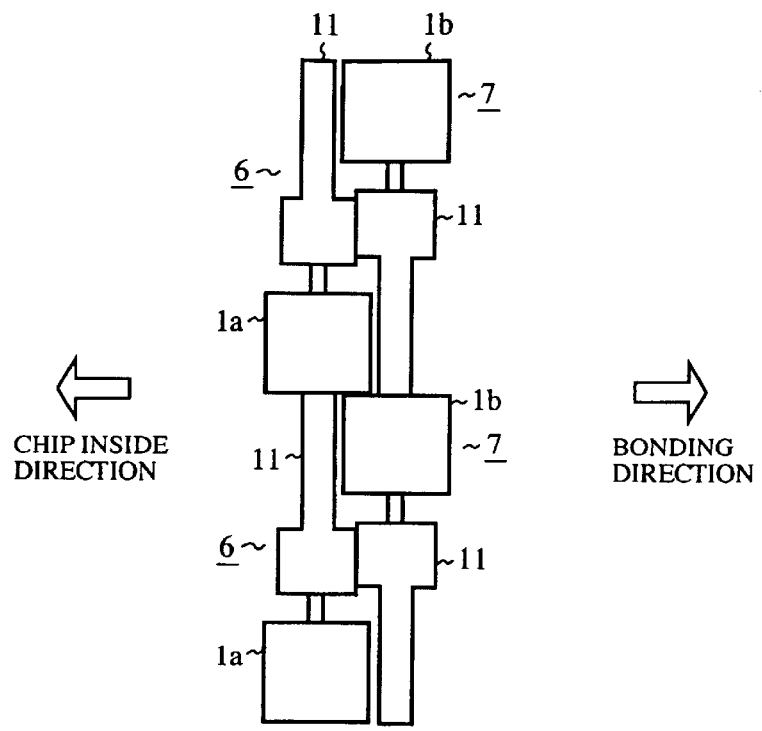
FIG. 6 is a layout diagram showing the semiconductor device in accordance with an embodiment 5 of the present invention.

FIG. 6 is a layout diagram showing the semiconductor device in accordance with an embodiment 5 of the present invention. Referring to the figure, reference numeral 11 denotes the pad-control portion that is narrowed at its part that is close to the pad that is adjacent to the pad-control portion in the bonding direction within the internal row pad 6 and the external row pad 7 forming a pair, to thereby have a generally T-shape in the outer appearance.

The semiconductor device has the same configuration as the device shown in FIG. 5 except this feature.

The operation will now be described as below.

In FIG. 6, the pad-control portion 11 is narrowed at its part that is close to the pad that is adjacent to the pad-control portion in the bonding direction within the internal row pad 6 and the external row pad 7 forming a pair, to thereby have a generally T-shape in the outer appearance.

In such a way, the area occupied by the pads 1a, 1b and the pad-control portions 11 is reduced with respect to the bonding direction. Such a configuration can further bring to a smaller area of the semiconductor chip.

In addition, in the embodiment 5, the connection wiring connecting the pad-control portion 11 of the external row pad 7 and the inside of the semiconductor chip, as shown in the embodiment 3, is optionally formed directly below the pads 1a, 1b by use of a metal wiring of lower-layer than the pads 1a, 1b. In this case, the above-mentioned wiring can maintain the reduction of the size of the semiconductor chip because the connection wiring 12 is formed directly below the pads 1a, 1b without detouring around the pads 1a, 1b.

As described above, according to the embodiment 5, the pattern shape of the pad-control portion 11 is formed in a substantially T-shape to be narrowed in the vicinity of the pads 1a, 1b adjacent to each other perpendicularly in the bonding direction, whereby the pattern pitch between the pads 1a, 1b can be narrowed, thereby developing a smaller area of the semiconductor chip.

Embodiment 6

Figure 7:
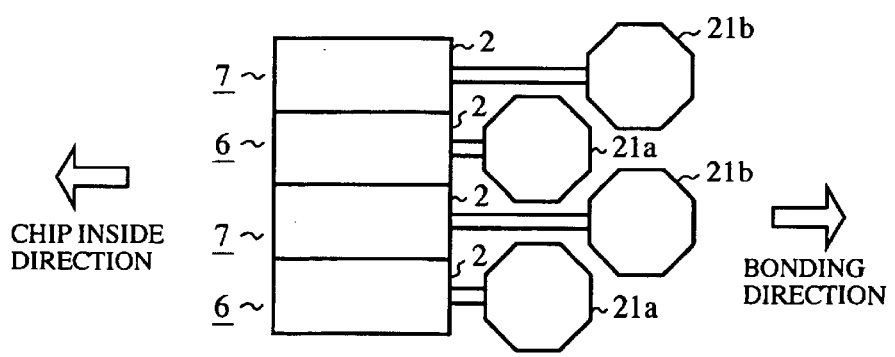
FIG. 7 is a layout diagram showing the semiconductor device in accordance with an embodiment 6 of the present invention.

FIG. 7 is a layout diagram showing the semiconductor device in accordance with an embodiment 6 of the present invention. Referring to the figure, reference numeral 21 denotes a pad in which the four corners of a rectangular pattern are cut or rounded off; and 2 denotes a pad-control portion which controls the input signal from the pad 21 or the output signal to the pad 21. Reference numeral 6 denotes an internal row pad in which the distance between the pad 21 thereof and the pad-control portion 2 thereof is short; and 7 denotes an external row pad in which the distance between the pad 21 thereof and the pad-control portion 2 thereof is long.

The pads 21 and the pad-control portions 2 of the internal row pad 6 and of the external row pad 7 each are disposed in the same direction as the bonding direction, and a plurality of the internal row pads 6 and a plurality of the external row pads 7 each are alternately disposed adjacent perpendicularly to the bonding direction.

The operation will now be described as below.

Referring to FIG. 7, the pad 21 is provided with the pad-control portion 2. The pad-control portion 2 level-shifts or controls the input/output signals of the pad 21 by use of two power supplies.

There is a minimum size to the pad 21 because the pad 21 is bonded with a wire. Moreover, there is a minimum length to the spacing between the pads 21 adjacent to each other because the deterioration of the electrical properties of the signals input thereto and output therefrom must be prevented.

In FIG. 7, the internal row pads 6 having a short distance between the pad 21 and the pad-control portion 2 and the external row pads 7 having a long distance between the pad 21 and the pad-control portion 2 each are alternately disposed perpendicularly to the bonding direction, and the pads 21 thereof are disposed in a staggered arrangement. Thereby, the area occupied by the pads 21 and the pad-control portions 2 are reduced to meet the demand of the increasing number of pins on the chip. The pads 21 disposed in such an arrangement are referred to as staggered pads herein. A row pad having a short distance between this pad 21 and the pad-control portion 2 is referred to as an internal row pad 6, and a row pad having a long distance between this pad 21 and the pad-control portion 2 is referred to as an external row pad 7 herein.

In addition, in FIG. 7, rounding off the four corners of the pad 21 disposed in the staggered arrangement can further reduce the area occupied by the pads 21 and the pad-control portions 2, to thereby reduce the size of the semiconductor chip. Moreover, forming a pad 21 having an octagonal shape can bring about a radial symmetry to the pad 21, to thereby improve the electrical properties of the pad 21.

As described above, according to the embodiment 6, since the pad 21a of the internal row pad 6 and the pad 21b of the external row pad 7 are radially formed in an octagonal shape in the pattern appearance, the arrangement area of the pads 21a, 21b and pad-control portion 2 can be reduced in the bonding direction, thereby performing a smaller area of the semiconductor chip.

Embodiment 7

Figure 8:
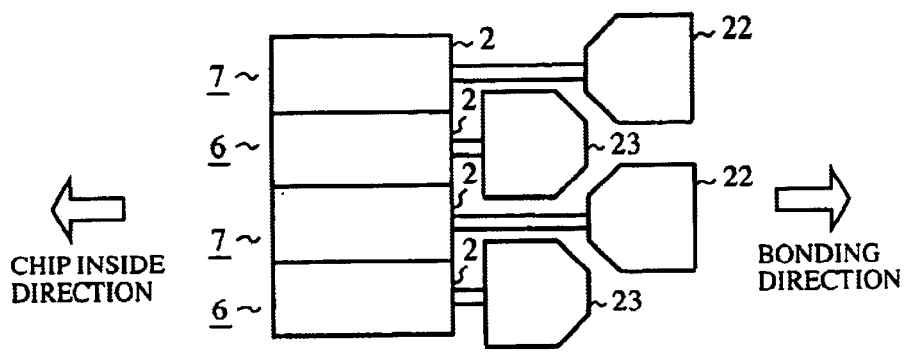
FIG. 8 is a layout diagram showing the semiconductor device in accordance with an embodiment 7 of the present invention.

FIG. 8 is a layout diagram showing the semiconductor device in accordance with an embodiment 7 of the present invention. Referring to the figure, reference numeral 22 denotes a pad of an external row pad 7, in which the two corners thereof that oppose the pads 23 of internal row pads 6 adjacent to the external row pad 7 are rounded off, and 23 denotes a pad of the internal row pad 6, in which the two corners thereof that oppose the pads 22 of the external row pads 7 adjacent to the internal row pad 6 are rounded off. The semiconductor device has the same configuration as the device shown in FIG. 7 except this feature.

The operation will now be described as below.

In FIG. 8, the pads 22 of the external row pad 7, in which the two corners thereof opposing the pads 23 are rounded or cut off, and the pads 23 of the internal row pads 6, in which the two corners thereof opposing the pads 22 are rounded off, can reduce the layout area of the pads 22, 23, and the pad-control portions 2 with respect to the bonding direction, thereby performing a smaller area of the semiconductor chip.

As described above, according to the embodiment 7, since the pad 23 of the internal row pad 6 and the pad 22 of the external row pad 7 is constructed by a pattern which the opposed corners are rounded off, the arrangement area of the pads 22, 23 and pad-control portion 2 can be reduced in the bonding direction, thereby performing a smaller area of the semiconductor chip.

What is claimed is:

1. A semiconductor device comprising: a plurality of internal row pads and a plurality of external row pads, each including a pad; and a pad-control portion that controls an input signal from the pad and an output signal to the pad,
   wherein the pad and the pad-control portion within the internal row pad are disposed in a relationship of reversed arrangement with the pad and the pad-control portion within the external row pad,
   the pads and the pad-control portions of the internal row pad and of the external row pad are disposed in the same direction as the bonding direction, and
   a plurality of the internal row pads and a plurality of the external row pads each are alternately disposed adjacent to each other and perpendicularly to the bonding direction.

2. The semiconductor device according to claim 1, wherein the pad-control portion is narrowed in the vicinity of the pad adjacent to the pad-control portion perpendicularly to the bonding direction, to thereby have a generally T-shape.

3. The semiconductor device according to claim 1, wherein a wiring connecting the pad-control portion of the internal row pad and the inside of the semiconductor chip is formed directly below the pad by use of a metal wiring of a lower layer than the pad.

4. A semiconductor device comprising: a plurality of internal row pads and a plurality of external row pads, each including a pad; and a pad-control portion that controls an input signal from the pad and an output signal to the pad,
   wherein the pad and the pad-control portion within the internal row pad are disposed in a relationship of reversed arrangement with the pad and the pad-control portion within the external row pad,
   the pads and the pad-control portions of the internal row pad and of the external row pad are disposed perpendicularly to the bonding direction, and
   a plurality of the internal row pads and the external row pads forming a pair in the bonding direction are disposed perpendicularly to the bonding direction.

5. The semiconductor device according to claim 4, wherein the pad-control portion is narrowed at its part that is close to the pad that is adjacent to the pad-control portion in the bonding direction within the internal row pad and the external row pad forming a pair, to thereby have a generally T-shape.

6. The semiconductor device according to claim 4, wherein a wiring connecting the pad-control portion of the external row pad and the inside of the semiconductor chip is formed directly below the pad by use of a metal wiring of lower-layer than the pad.

7. A semiconductor device comprising: a plurality of internal row pads and a plurality of external row pads, each including a pad having a rectangular pattern and a pad-control portion that controls an input signal from the pad and an output signal to the pad,
   wherein said internal row pads and said external row pads are disposed in a staggered arrangement closer to the chip outside than said pad-control portion, and wherein at least one corner of the rectangular pattern is rounded off in the pattern shape of said pad.

8. The semiconductor device according to claim 7, wherein the pattern shape of the pad is formed in an octagonal shape.

9. The semiconductor device according to claim 7, wherein the opposed corners are rounded off in the adjacent pads in a staggered arrangement in the pattern shape of the pads.

* * * * *